US008471638B2

(12) United States Patent
Deguchi

(10) Patent No.: US 8,471,638 B2
(45) Date of Patent: Jun. 25, 2013

(54) DOHERTY AMPLIFIER

(75) Inventor: Hiroaki Deguchi, Kanagawa (JP)

(73) Assignee: Sumitomo Electric Device Innovations, Inc., Yokohama-shi, Kanagawa (JP)

(*) Notice: Subject to any disclaimer, the term of this patent is extended or adjusted under 35 U.S.C. 154(b) by 45 days.

(21) Appl. No.: 13/194,421

(22) Filed: Jul. 29, 2011

(65) Prior Publication Data

US 2012/0025916 A1 Feb. 2, 2012

(30) Foreign Application Priority Data

Jul. 29, 2010 (JP) ................................ 2010-171092

(51) Int. Cl.
*H03F 3/68* (2006.01)
(52) U.S. Cl.
USPC ...................................... 330/295; 330/124 R
(58) Field of Classification Search
USPC .............. 330/295, 124 R, 285, 296, 129, 136
See application file for complete search history.

(56) References Cited

U.S. PATENT DOCUMENTS

| | | | | |
|---|---|---|---|---|
| 5,757,229 A | * | 5/1998 | Mitzlaff | 330/124 R |
| 7,248,110 B2 | * | 7/2007 | Dittmer et al. | 330/124 R |
| 8,233,858 B2 | * | 7/2012 | Sorrells et al. | 455/127.1 |
| 8,265,572 B2 | * | 9/2012 | Kenington | 455/101 |

FOREIGN PATENT DOCUMENTS

JP 2005-322993 A 11/2005

* cited by examiner

*Primary Examiner* — Henry Choe
(74) *Attorney, Agent, or Firm* — Westerman, Hattori, Daniels & Adrian, LLP

(57) ABSTRACT

An amplifier includes a Doherty amplifier composed of a distributor distributing an input signal to two signals, a carrier amplifier that receives one of the two signals and has a first FET, a peaking amplifier that receives the other one of the two signals and has a second FET, and a combiner that transforms an output impedance of the carrier amplifier and combines outputs of the carrier amplifier and the peaking amplifier, and a voltage controller that changes at least one of a gate voltage and a drain voltage supplied to at least one of the first FET and the second FET in accordance with a frequency of the input signal when the frequency of the input signal varies.

9 Claims, 5 Drawing Sheets

DOHERTY AMPLIFIER

CROSS-REFERENCE TO RELATED APPLICATION

This application is based upon and claims the benefit of priority of the prior Japanese Patent Application No. 2010-171092 filed on Jul. 29, 2010, the entire contents of which are incorporated herein by reference.

BACKGROUND (i) Technical Field

A certain aspect of the embodiments discussed herein is related to an amplifier.

(ii) Related Art

A Doherty amplifier is used as radio communications amplifier (see Japanese Patent Application Publication No. 2005-322993). The Doherty amplifier includes a carrier amplifier and a peaking amplifier. The carrier amplifier is an amplifier that primarily amplifies an input signal. The peaking amplifier is an amplifier that amplifies the peak of the input signal. For example, the carrier amplifier always amplifies the input signal. In contrast, the peaking amplifier amplifies the input signal only when the input signal has power equal to or higher than a predetermined level.

The Doherty amplifier includes an impedance transformer composed of, for example, a $\lambda/4$ phase line, an inductor and a capacitor. This kind of impedance transformer has a frequency dispersion characteristic for high frequency signals. This may result in a difference between the center frequency of the input signal and the center frequency of the amplifier and may decrease the drain efficiency.

SUMMARY

According to an aspect of the present invention, there is provided a Doherty amplifier including: a Doherty circuit having a carrier amplifier having a first FET, and a peaking amplifier having a second FET; and a voltage controller that controls at least one of a gate voltage and a drain voltage supplied to at least one of the first FET and the second FET in accordance with a frequency of an input signal of the Doherty amplifier.

DETAILED DESCRIPTION

Embodiments of the present invention are described below with reference to the accompanying drawings.

(First Embodiment)

Figure 1:
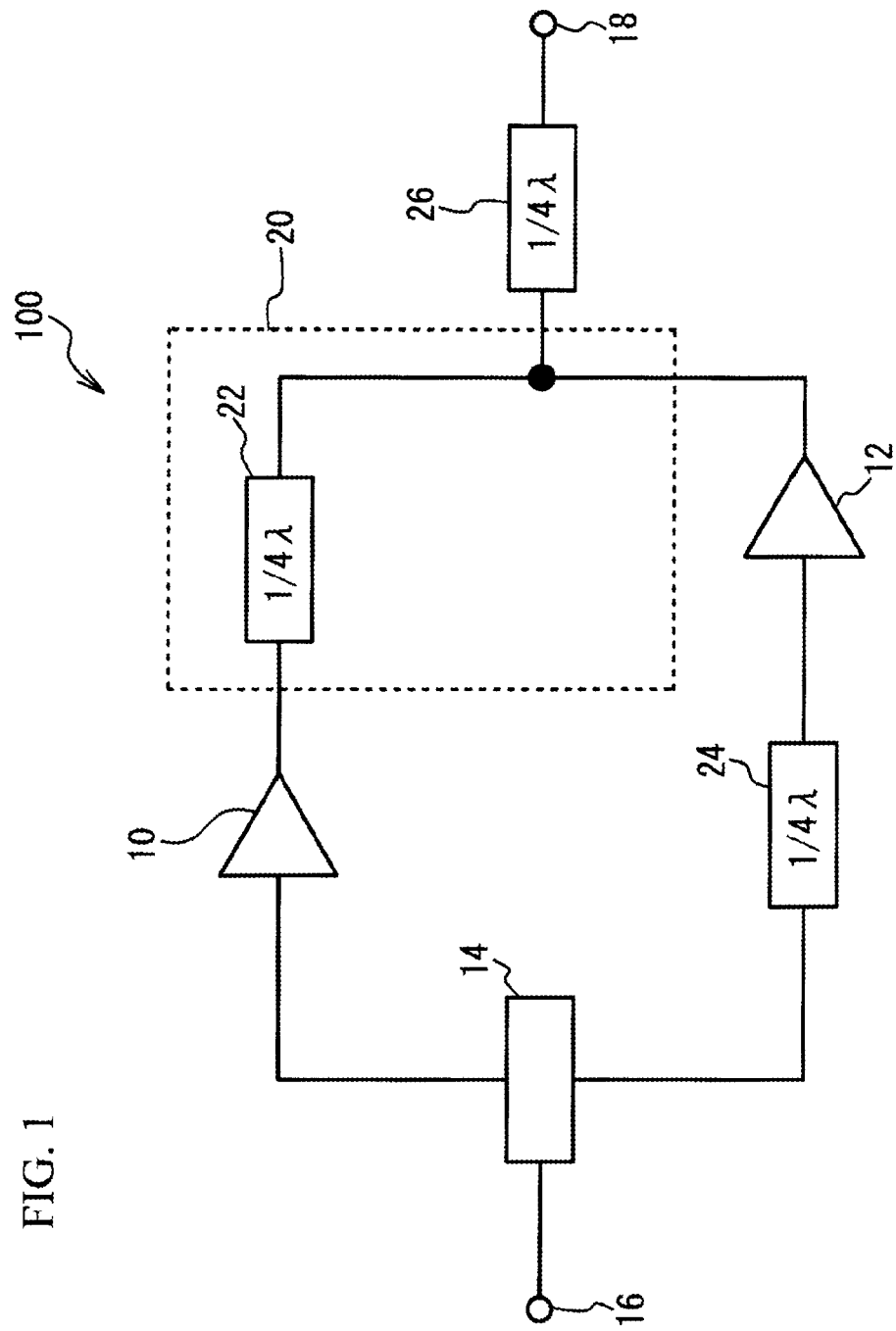
FIG. 1 is a circuit diagram of a Doherty amplifier in accordance with a first embodiment.

FIG. 1 is a circuit diagram of a Doherty amplifier included in an amplifier in accordance with a first embodiment. A Doherty amplifier 100 includes a carrier amplifier 10, a peaking amplifier 12, a distributor 14 and a combiner 20. The distributor 14 distributes an input signal applied to an input terminal 16 to two paths. For example, the distributor 14 equally distributes the input signal to two signals. The carrier amplifier 10 receives one of the two input signals and amplifies the input signal. The peaking amplifier 12 receives the other input signal and amplifies it. The combiner 20 has a node at which the output signal of the carrier amplifier 10 and that of the peaking amplifier 12 are combined, and $\lambda/4$ phase lines 22. The $\lambda/4$ phase line 22 is connected to a next stage of the carrier amplifier 10. The $\lambda/4$ phase line 26 is connected to the next stage of the node at which the outputs of the carrier amplifier 10 and the peaking amplifier 12 are combined. The combiner 20 adjusts the impedances of the outputs of the carrier amplifier 10 and the peaking amplifier 12, and combines the output signals thereof. The signal output by the combiner 20 is output via an output terminal 18. A $\lambda/4$ phase line 24 is connected to the preceding stage of the peaking amplifier 12.

The $\lambda/4$ phase line 22 performs an impedance transformation so that the load connected to the output of the carrier amplifier 10 is twice the load connected to the output terminal 18 when power is as low as only the carrier amplifier 10 operates. In contrast, when power is as high as both the carrier amplifier 10 and the peaking amplifier 12 operate, the $\lambda/4$ phase line 22 performs an impedance transformation so that the load connected to the outputs of the carrier amplifier 10 and the peaking amplifier 12 is equal to that connected to the output terminal 18. The $\lambda/4$ phase line 24 is a line intended to compensate for a phase difference between the carrier amplifier 10 and the peaking amplifier 12 due to the $\lambda/4$ phase line 22 associated with the carrier amplifier 10. The $\lambda/4$ phase line 26 matches the impedance of the node at which the outputs of the carrier amplifier 10 and the peaking amplifier 12 are combined with the characteristic of a stage that is connected to the next stage of the node.

The carrier amplifier 10 is, for example, a class-A or class-AB amplifier, and always amplifies the distributed signal from the distributor 14. The peaking amplifier 12 is, for example, a class-C amplifier, and amplifies the distributed signal that has a power higher than a predetermined power.

Figure 2:
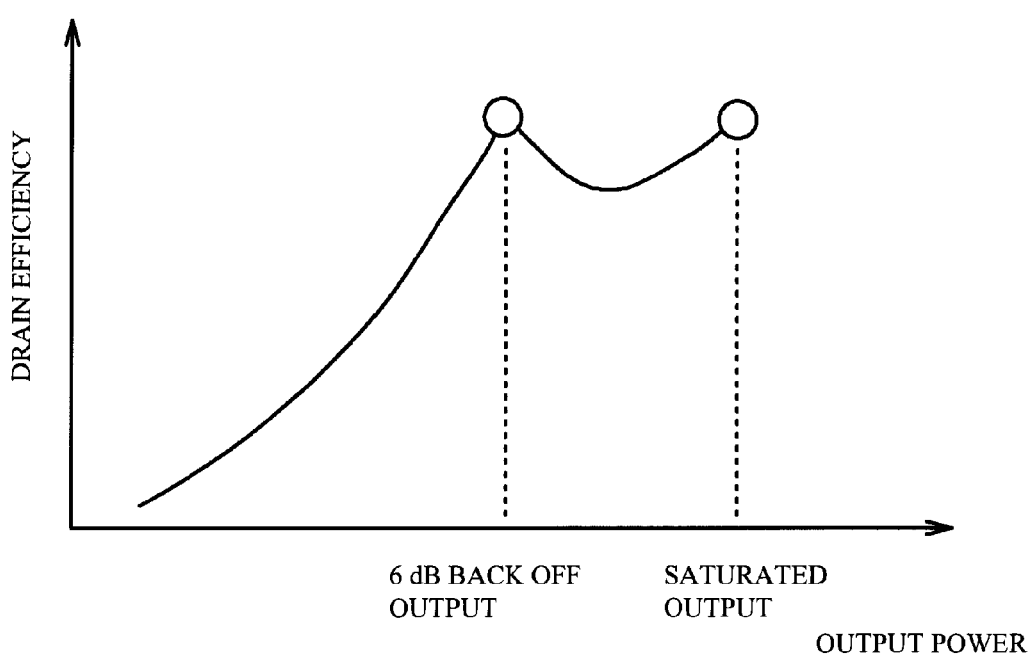
FIG. 2 is a graph of the drain efficiency associated with the output power of the Doherty amplifier.

FIG. 2 is a graph that illustrates the drain efficiency associated with the output power of the Doherty amplifier. Referring to FIG. 2, when the output power is saturated, the carrier amplifier 10 and the peaking amplifier 12 have respective saturated powers. Thus, the drain efficiency is maximized. At an output that is 6 dB lower than the saturated power (6 dB back-off output), only the carrier amplifier 10 has the saturated power, and the peaking amplifier 12 does not amplify the signal. This case also has the maximum drain efficiency. Since the drain efficiency is maximized at two output powers, it is possible to obtain a wide range of output power having high drain efficiencies. For example, in many cases, power amplifiers for digital modulation signals are operated at an output power that is 5 dB~8 dB lower than the saturated power in order to maintain the linearity. The Doherty amplifier is capable of improving the drain efficiency at back-off powers, as illustrated in FIG. 2.

Figure 3:
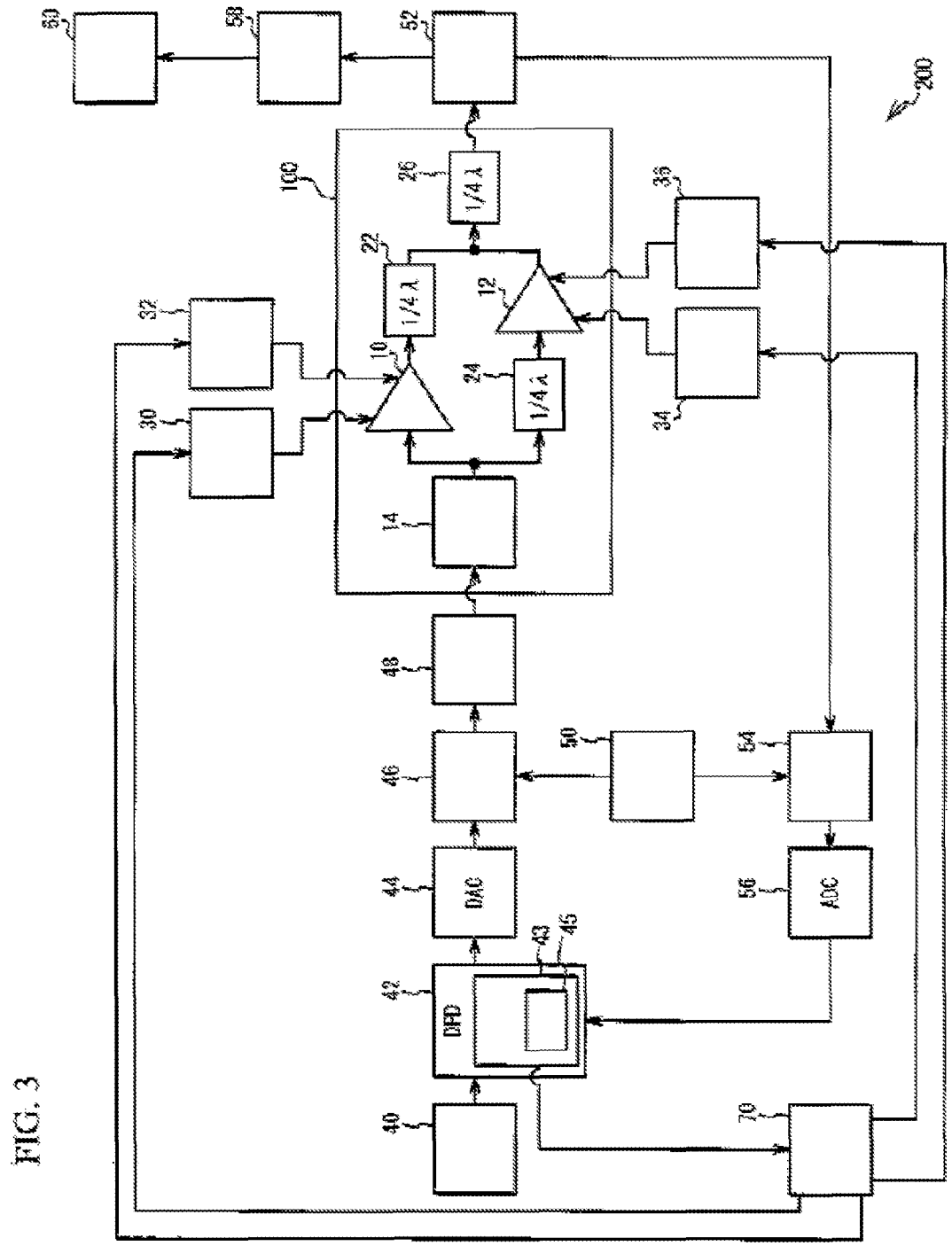
FIG. 3 is a block diagram of an exemplary configuration of the Doherty amplifier of the first embodiment.

FIG. 3 is a block diagram of an amplifier in accordance with a first embodiment. Referring to FIG. 3, an amplifier 200 includes a digital signal generator 40, a digital pre-distortion unit (DPD) 42, a digital-to-analog converter (DAC) 44, an up converter 46, a signal generator 50, an amplifier 48, the Doherty amplifier 100, gate voltage supply circuits 30 and 34, drain voltage supply circuits 32 and 36, a directional coupler 52, a bandpass filter 58, an antenna 60, a down converter 54, an analog-to-digital converter (ADC) 56, and a voltage controller 70.

The digital signal generator 40 generates a baseband signal, which is a digital signal, and outputs it to the DPD 42. The DPD 42 compensates for a distortion caused when the Doherty amplifier 100 amplifies the signal. For computation directed to compensating for the distortion characteristic of the Doherty amplifier 100, the DPD 42 stores compensation values used to compensate for distortion of the baseband signal in a table 45 extended in a built-in memory 43. The DPD 42_looks up the table 45 and outputs a digital signal that compensates for a distortion of the baseband signal. The DAC 44 converts the digital signal from the DPD 42 to an analog signal. The up converter 46 converts the analog signal from the DAC 44 to a frequency of a signal output by the signal generator 50, and outputs a resultant RF signal. The amplifier 48 amplifiers the RF signal from the up converter 46, and outputs the amplified RF signal to the Doherty amplifier 100.

The Doherty amplifier 100 amplifies the output of the amplifier 48. The structure of the Doherty amplifier 100 illustrated in FIG. 3 is the same as illustrated in FIG. 1, and a description thereof is omitted here. The gate voltage supply circuit 30 that generates a gate voltage is connected to the gate of a first FET of the carrier amplifier 10, and the drain voltage supply circuit 32 that generates a drain voltage is connected to the drain thereof. The gate voltage supply circuit 34 that generates a gate voltage is connected to the gate of a second FET of the peaking amplifier 12, and the drain voltage supply circuit 36 that generates a drain voltage is connected to the drain thereof. The directional coupler 52 distributes the output of the Doherty amplifier 100 to two signals. One of the two signals passes through the bandpass filter 58, which extracts only predetermined frequency components from the received signal. The predetermined frequency components are applied to the antenna 60. The other signal is converted to frequencies of the baseband signal by the down converter 54, which are then converted to a digital signal by the ADC 56. The digital signal thus produced is fed back to the DPD 42. Thus, the distortion characteristic of the Doherty amplifier 100 can be compensated for.

The voltage controller 70 changes at least one of the gate voltage and the drain voltage supplied to at least one of the first FET and the second FET when the frequency of the RF input signal applied to the Doherty amplifier 100 varies. The voltage controller 70 has a table memory for storing a relationship of the frequency of the RF input signal and at least one of the gate voltage and the drain voltage supplied to at least one of the first FET and the second FET. For example, for a predetermined frequency of the RF input signal, at least one of the gate voltage and the drain voltage supplied to at least one of the first and second FETs having a drain efficiency equal to or higher than a predetermined value is measured and stored in the table memory. In this case, the voltage controller 70 changes at least one of the gate voltage and the drain voltage supplied to at least one of the first and second FETs by referring to the table memory.

It is thus possible to increase the drain efficiency to the predetermined value or greater and to prevent the drain efficiency from decreasing.

Figure 4:
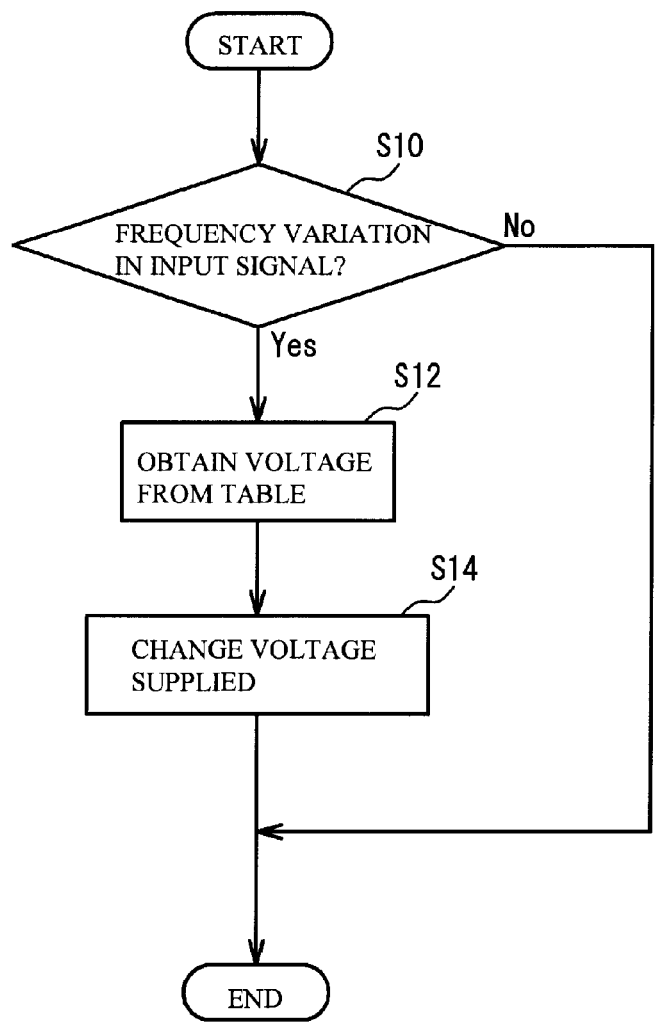
FIG. 4 is a flowchart of a process of a voltage controller of the first embodiment.

FIG. 4 is a flowchart of a process by the voltage controller 70 in accordance with the first embodiment. Referring to FIG. 4, the voltage controller 70 determines whether there is a variation in the frequency of the RF input signal (step S10). For example, the voltage controller 70 acquires the frequency of the signal generator 50 with a predetermined period, and determines there is a frequency variation in the RF input signal. When no frequency variation is observed (No at step S10), the voltage controller 70 ends the process. In contrast, when a frequency variation is observed (Yes at step S10), the voltage controller 70 obtains, from the table memory, at least one of the gate voltage and the drain voltage supplied to at least one of the first FET and the second FET (step S12). The voltage controller 70 sets the voltage acquired at step S12 to any of the gate voltage supply circuits 30 and 34 and the drain voltage supply circuits 32 and 36 in order to change at least one of the gate voltage and the drain voltage supplied to at least one of the first FET and the second FET (step S14). Then, the voltage controller 70 ends the process.

In the first embodiment, the voltage controller 70 changes at least one of the gate voltage and the drain voltage supplied to at least one of the first FET and the second FET on the basis of the frequency of the input signal by referring to the table memory when the voltage controller 70 detects a frequency variation of the RF input signal. For example, when the drain current of the peaking amplifier 12 increases due to a frequency variation of the RF input signal, the voltage controller 70 changes the gate voltage of the second FET to decrease the drain current of the peaking amplifier 12. It is thus possible to suppress the drain efficiency from decreasing. For example, when the drain current of the carrier amplifier 10 increases due to a frequency variation of the RF input signal, the voltage controller 70 changes the gate voltage of the first FET to decrease the drain current of the carrier amplifier 10. In contrast, when the drain current of the carrier amplifier 10 decreases, the voltage controller 70 changes the gate voltage of the first FET to increase the drain current of the carrier amplifier 10. It is thus possible to suppress decrease of the drain efficiency. In an exemplary case where the saturated output decreases due to a frequency variation of the RF input signal, the drain voltages of the first and second FETs are increased. It is thus possible to prevent the saturated output from decreasing.

In the first embodiment, when the frequency of the RF input signal varies, the voltage controller 70 may execute another control in which the gate voltage and the drain voltage of the first FET are not changed but at least one of the gate voltage and the drain voltage of the second FET is changed in accordance with the frequency of the RF input signal. When there is a frequency variation in the RF input signal, the voltage controller 70 may execute yet another control in which the drain voltage of the first FET is not changed but the drain voltage of the second FET is increased. In this case, it is preferable that the gate voltages of the first and second FETs are not changed. Since the drain current that flows through the peaking amplifier 12 is smaller than the drain current that flows through the carrier amplifier 10, it is possible to suppress an increase in power consumption of the whole amplifier by increasing the drain voltage of only the peaking amplifier 12. It is thus possible to suppress decrease in the drain efficiency.

In the first embodiment, the condition for changing at least one of the gate voltage and the drain voltage supplied to at least one of the first FET and the second FET in accordance with the frequency of the RF input signal is such that the RF signal has a frequency variation so as to exceed a band width having a fractional bandwidth of 3% (approximately 64 MHz) when it is supposed that the Doherty amplifier 100 is designed to have a center frequency of 2.14 GHz. That is, the above corresponds to a case where the frequency of the RF input signal is lower than 2108 MHz or is higher than 2172 MHz. When the frequency of the RF input signal is within a range having a fractional frequency of 3% with respect to the center frequency of the amplifier, good amplification characteristics and good power efficiency can be obtained easily. In the case where the frequency of the RF input signal exceeds the range having a fractional frequency of 3% with respect to the center frequency of the amplifier, at least one of the gate voltage and the drain voltage supplied to at least one of the first and second FETs is changed, so that decrease in the drain efficiency can be suppressed.

The contents of the table memory may be the results of a measurement conducted previously. The contents of the table memory may be changed dynamically.

The first embodiment has the memory 43 and the DPD 42, which is the distortion compensation part for compensating for distortion of the output signal of the Doherty amplifier 100.

(Second Embodiment)

Figure 5:
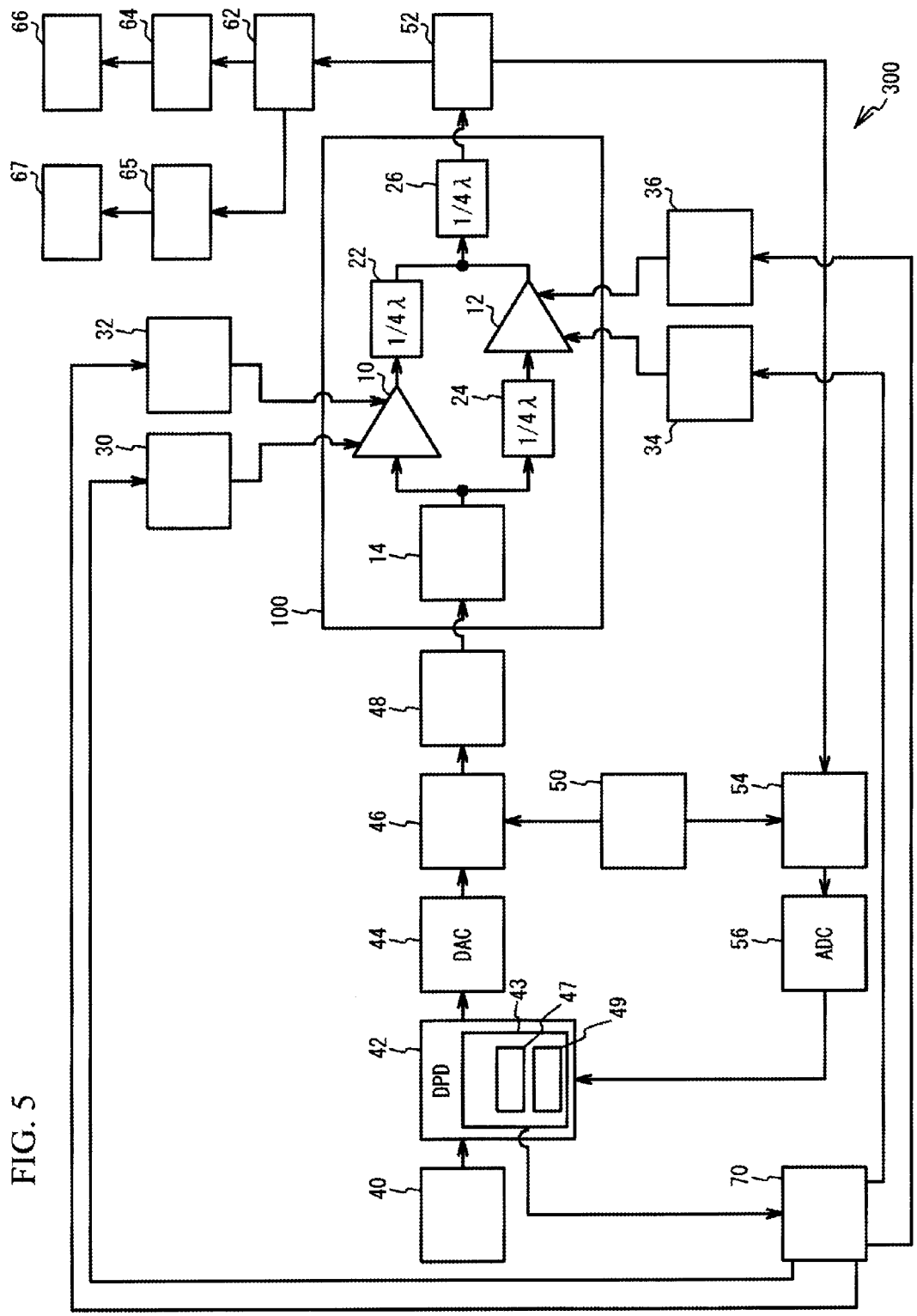
FIG. 5 is a block diagram of an amplifier in accordance with a second embodiment.

FIG. 5 is a block diagram of an exemplary configuration of an amplifier in accordance with a second embodiment. Referring to FIG. 5, and amplifier 300 differs from the amplifier 200 illustrated in FIG. 3 in that the bandpass filter 58 and the antenna 60 in FIG. 3 are replaced by a switch 62, bandpass filters 64 and 65, and antennas 66 and 67. Further, the memory 43 of the amplifier 200 stores tables 47 and 49 instead of the table 45.

Referring to FIG. 5, the switch 62 switches the output destination of the signal from the directional coupler 52 in accordance with the frequency band. For example, when the amplifier 300 is used for a base station of W-CDMA (Wideband Code Division Multiple Access), the switch 62 is controlled to output the signal from the directional coupler 52 to the bandpass filter 64 in a case where the frequency of the RF input signal is in a band of 1.8 to 1.85 GHz (hereinafter, referred to as frequency band 1). The switch 62 is controlled to output the signal from the directional coupler 52 to the bandpass filter 65 in a case where the frequency of the RF input signal is in a band of 2.11 to 2.17 GHz (hereinafter, referred to as frequency band 2). The bandpass filters 64 and 65 extract the corresponding frequency components from the received signals and supply those to the antennas 66 and 67, respectively.

The memory 43 stores the tables 47 and 49, which are used for distortion compensation processes respectively involved in the frequency bands 1 and 2. The DPD 42 determines whether the frequency of the RF input signal of the Doherty amplifier 100 belongs to the frequency band 1 or the frequency band 2, and selects the appropriate one of the two tables 47 and 49 for the corresponding distortion compensation process.

In a case where there is a frequency variation of the RF input signal, the voltage controller 70 changes at least one of the gate voltage and the drain voltage supplied to at least one of the first FET and the second FET in accordance with the frequency of the RF input signal by referring to the table 47 or 49. The tables 47 and 49 associate the frequencies of the RF input signals in the frequency bands 1 and 2 with at least one of the gate voltage and the drain voltage supplied to be at least one of the first FET and the second FET by the voltage controller 70 in accordance with the frequency of the RF input signal. The voltage controller 70 selectively uses the tables 47 and 49 in accordance with the frequency band of the RF input signal, and changes at least one of the gate voltage and the drain voltage supplied to at least one of the first FET and the second FET.

The voltage controller 70 of the second embodiment selectively uses the tables 47 and 49 and changes at least one of the gate voltage and the drain voltage supplied to at least one of the first FET and the second FET. It is thus possible to suppress decrease in the drain efficiency.

The present invention is not limited to the specifically described embodiments but may include various embodiments and variations within the scope of the present invention.

What is claimed is:

1. A Doherty amplifier comprising:
a Doherty circuit having a carrier amplifier having a first FET, and a peaking amplifier having a second FET; and
a voltage controller that controls at least one of a gate voltage and a drain voltage supplied to at least one of the first FET and the second FET in accordance with an output signal of a distortion compensation part that adds a distortion inverted of a distortion that occurs in the Doherty amplifier to the input signal.

2. The amplifier according to claim 1, wherein the voltage controller controls the gate and the drain voltage of the first FET in fixed value, and varies the gate or the drain voltage of the second FET in accordance with change of the frequency of the input signal.

3. The amplifier according to claim 1, wherein the voltage controller controls the drain voltage of the first FET in fixed value, and varies the drain voltage of the second FET in accordance with change of the frequency of the input signal.

4. The amplifier according to claim 1, further comprising a memory that stores a table of a relationship between a frequency of the input signal and a voltage of the first or second FET.

5. The amplifier according to claim 1, wherein the distortion compensation part controls the distortion in accordance with an output of the Doherty amplifier.

6. The amplifier according to claim 5, wherein the distortion compensation part refers a base-band frequency of the output of the Doherty amplifier.

7. The amplifier according to claim 4, wherein the table has the tables of different frequency bands.

8. The amplifier according to claim 7, wherein the different frequency bands are 1.8 GHz to 1.85 GHz and 2.11 GHz to 2.17 GHz.

9. The amplifier according to claim 1, wherein the distortion compensation part is Digital Pre-Distortion unit.

* * * * *